(12) United States Patent
Slaughter et al.

(10) Patent No.: US 6,783,637 B2
(45) Date of Patent: Aug. 31, 2004

(54) HIGH THROUGHPUT DUAL ION BEAM DEPOSITION APPARATUS

(75) Inventors: Jon M. Slaughter, Tempe, AZ (US); Gerald Steiner, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 33 days.

(21) Appl. No.: 10/285,161

(22) Filed: Oct. 31, 2002

(65) Prior Publication Data

US 2004/0084299 A1 May 6, 2004

(51) Int. Cl.$^7$ .............................................. C23C 14/34
(52) U.S. Cl. ............................. 204/192.11; 204/298.04; 250/423 R; 250/423 F; 315/111.51; 315/111.81
(58) Field of Search ........................ 204/192.11, 298.04; 250/423 R, 423 F; 315/111.51, 111.81

(56) References Cited

U.S. PATENT DOCUMENTS 4,142,958 A * 3/1979 Wei et al. .............. 204/192.11
5,454,919 A * 10/1995 Hill et al. .............. 204/192.11

* cited by examiner

*Primary Examiner*—Rodney G. McDonald
(74) *Attorney, Agent, or Firm*—Ingrassia Fisher & Lorenz PC

(57) ABSTRACT

An ion beam deposition system for sputtering material layers comprising a vacuum chamber, a substrate positioned in the vacuum chamber, a first target holder capable of holding at least one target of a first material, said first target holder being positioned in the vacuum chamber, a second target holder capable of holding at least one target of a second material, said second target holder being positioned in the vacuum chamber, a first ion beam source for directing ions at the at least one target of the first material for depositing said first material onto the substrate, and a second ion beam source for directing ions at the at least one target of the second material for depositing said second material onto the substrate. Said deposition system includes a control system that allows materials to be deposited from the first and second target holder with negligible delay between the depositions.

27 Claims, 5 Drawing Sheets

- PRIOR ART -

203 FIG. 1

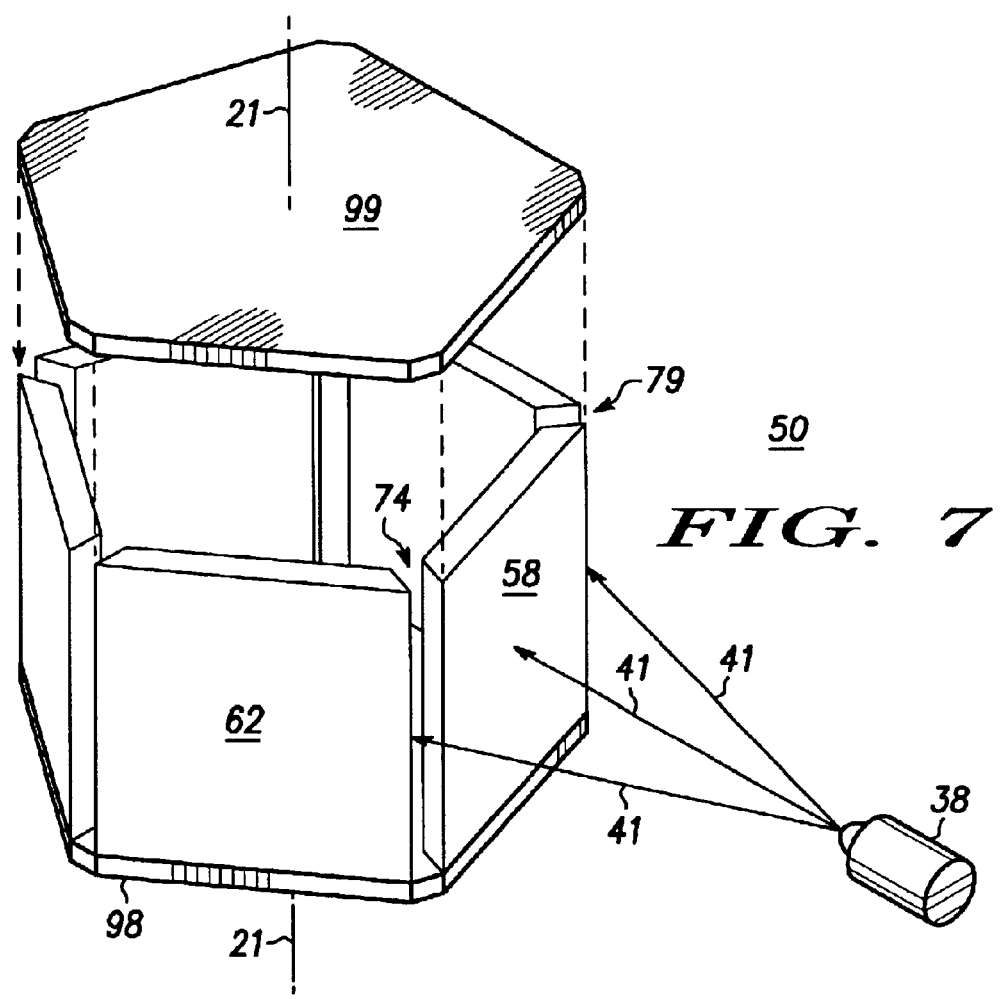

HIGH THROUGHPUT DUAL ION BEAM DEPOSITION APPARATUS

FIELD OF THE INVENTION

This invention relates to an apparatus for the deposition of thin films, and, more particularly, the present invention relates to an apparatus for depositing a multilayered material from a sputtering target.

BACKGROUND OF THE INVENTION

Memory devices are an extremely important component in electronic systems. The three most important commercial high-density memory technologies are SRAM, DRAM, and FLASH. Each of these memory devices uses an electronic charge to store information and each has its own advantages. SRAM has fast read and write speeds, but it is volatile and requires large cell area. DRAM has high density, but it is also volatile and requires a refresh of the storage capacitor every few milliseconds. This requirement increases the complexity of the control electronics.

FLASH is the major nonvolatile memory device in use today. Typical non-volatile memory devices use charges trapped in a floating oxide layer to store information. Drawbacks to FLASH include high voltage requirements and slow program and erase times. Also, FLASH memory has a poor write endurance of $10^4$–$10^6$ cycles before memory failure. In addition, to maintain reasonable data retention, the thickness of the gate oxide has to stay above the threshold that allows electron tunneling, thus restricting FLASH's scaling trends.

To overcome these shortcomings, magnetic memory devices are being evaluated. One such device is magnetoresistive random access memory (hereinafter referred to as "MRAM"). MRAM has the potential to have speed performance similar to DRAM. To be commercially viable, however, MRAM must have comparable memory density to current memory technologies, be scalable for future generations, operate at low voltages, have low power consumption, and have competitive read/write speeds.

MRAM devices are typically fabricated using sputtering deposition systems, such as physical vapor deposition (hereinafter referred to as "PVD") systems or ion beam deposition (hereinafter referred to as "IBD") systems. Such sputter-deposition systems create electromagnetic fields in an evacuated chamber into which an inert, ionizable gas, such as argon, is introduced.

Turn now to FIG. 1 which illustrates a prior art ion beam deposition apparatus 203. Ion beam deposition apparatus 203 includes a vacuum chamber 210. A substrate stage 212 is positioned therein vacuum chamber 210 and a substrate 214 is positioned on substrate stage 212. Substrate 214 can include, for example, a silicon wafer or a similar supporting substrate.

A target holder 250 is positioned within vacuum chamber 210. Target holder 250 is capable of holding at least one holding member, such as a sputtering target. In this example, target holder 250 holds a target 258 with a surface 233, a target 262, a target 294, a target 295, and a target 296, wherein target 258 is initially positioned in a desired sputtering position 259 facing an ion beam source 238. Further, target holder 250 is rotatable about an individual axis 221, as will be discussed presently. Ion beam deposition apparatus 203 typically includes an assist ion beam source 297 to clean substrate 214 and subsequent layers grown thereon.

Ion beam source 238 directs a flux of ions 241 at target holder 250. It is well known by those skilled in the art that when a flux of ions strike a sputtering target, material from the sputtering target is sputtered through a continuous range of angles relative to the sputtering target. Atoms from the ion beam are also scattered from the target into a continuous range of angles. For example, when flux of ions 241 strikes the target in position 259, material from the target in position 259 is substantially sputtered in a direction 222, a direction 234, a direction 216, and a direction 219. Ions and atoms from the beam are also scattered with significant energy into those angles. Further, a stray beam from ion flux 241 is substantially directed in a direction 281. The material generally sputtered in direction 216 will be incident on substrate 214, as desired, to grow a material film thereon. Further, the atoms generally sputtered and scattered in directions 222, 219, and 234 and the stray beam in direction 281 can cause significant contamination within chamber 210 and on substrate 214 by resputtering material from the chamber walls or fixtures. Thus, it is desirable to shield the chamber walls and other regions where contamination may be generated to prevent this resputtered material from reaching substrate 214.

For example, the material sputtered and scattered in direction 219 typically sputters chamber 210 in a region 255 and causes a contamination flux 256. The material sputtered and scattered in direction 219 is generally sputtered at an angle, θ', relative to a reference line 268 oriented parallel to surface 233 of desired sputtering position 259. It will be understood that angle, θ', is typically within a range from 30° to 45°. In the prior art, a baffle 227 is sometimes positioned near region 255 on chamber 210 to shield contamination flux 256. Contamination flux 256 is generally sputtered along a reference line 270 which is not incident to substrate 214 and causes minimal contamination problems.

However, material sputtered in direction 222 typically sputters chamber 210 in a region 224 and causes a contamination flux 226 which is sputtered toward substrate 214 along a reference line 269. The material sputtered and scattered in direction 222 is generally called a forward scattered flux and is sputtered at a shallow angle, θ, relative to reference line 268. It will be understood that shallow angle, θ, is typically within a range given approximately from 0° to 20°. This forward scattered flux is of particular concern since it typically contains most energetic atoms. Contamination flux 226 is typically sputtered such that baffle 227 is insufficient to shield substrate 214.

The stray beam in direction 281 from ion flux 241 typically sputters chamber 210 in a region 284 and causes a contamination flux 282 which is sputtered toward substrate 214 along a reference line 283. The stray beam in direction 281 is generally a small flux of ions in a tail of the ion beam that misses the target and hits chamber 210 behind the targets in region 284. This stray beam will sputter material from the wall, some of which will deposit with the growing film and result in contamination.

To illustrate a method of operation for apparatus 203, consider the following example. Assume that it is desired to deposit a material layer 211 on substrate 214, a material layer 213 on material layer 211, a material layer 215 on material layer 213, and a material layer 217 on material layer 215 as illustrated in FIG. 1. Further assume that material layer 211 includes material sputtered from target 258, material layer 213 includes material sputtered from target 262, material layer 215 includes material sputtered from target 295, and material layer 217 includes material sputtered from target 296.

Initially, target 258 is positioned in desired sputtering position 259. To deposit material layer 211, ion beam source 238 is turned on. After material layer 211 is deposited, ion beam source 238 is turned off and target 262 is rotated into desired sputtering position 259. Ion source 238 is turned on to deposit material layer 213. After layer 213 is deposited, ion beam source 238 is turned off and target 295 is rotated to desired sputtering position 259.

Ion source 238 is turned on to deposit material layer 215. After layer 215 is deposited, ion beam source 238 is turned off and target 296 is rotated to desired sputtering position 259 to deposit material layer 217. It is well know by those skilled in the art that a time for rotation for target holder 250 is approximately 5 seconds to 10 seconds per target. The time for rotation is essentially wasted since apparatus 203 is idle while target holder 250 rotates.

Turn now to FIG. 2 which illustrates a pie chart 90 for a throughput of ion beam deposition apparatus 203. The throughput measures a number of wafers processed by apparatus 203 per hour. Pie chart 90 represents a percentage of time that apparatus 203 spends performing certain tasks during a specific deposition sequence. For example, apparatus 203 spends approximately 47% of its time depositing material layers, 16% of its time transferring wafers in and out of chamber 210, 12% of its time panning substrate 214, and 1% of its time burning in targets. The latency time of ion beam deposition apparatus 203 is 24%. It will be understood that these values depend on the material stack that is deposited.

The latency time is that when apparatus 203 is sitting idle waiting for a task to finish. As mentioned previously, target holder 250 takes approximately 5 seconds to 10 seconds to rotate from one target (i.e. target 258) to a next target (i.e. target 262) in a deposition sequence. Also, it is well known by those skilled in the art that various wafer cleaning steps and beam setup steps are performed during the deposition sequence. Further, it is well known by those skilled in the art that it is desirable to maximize the percentage of time apparatus 203 spends depositing films, which will increase the throughput. For example, apparatus 203 has a throughput of approximately 4.9 wafers per hour.

Accordingly, it is an object of the present invention to provide a new and improved ion beam deposition apparatus with an improved throughput and improved shielding.

SUMMARY OF THE INVENTION

To achieve the objects and advantages specified above and others, a method of depositing a material by sputtering is disclosed. The method comprises the steps of providing a vacuum chamber and providing a substrate positioned in the vacuum chamber. A first target holder capable of holding at least one first target holding member is positioned in the vacuum chamber, said first target holder being rotatable about a first individual axis. A second target holder capable of holding at least one second target holding member is positioned in the vacuum chamber proximate to the first target holder, said second target holder being rotatable about a second individual axis.

A first ion beam source for directing ions at the first target holder is positioned in the vacuum chamber and a second ion beam source for directing ions at the second target holder is positioned in the vacuum chamber and positioned proximate to the first ion beam source. One of the first plurality of target holding members which bears a first desired sputtering target is positioned into a first sputtering position. A desired one of the second plurality of target holding members which bears a second desired sputtering target is positioned into a second sputtering position.

The first ion beam source is used to deposit a portion of the first desired sputtering target onto the substrate to form a first material layer. The first ion beam source is then turned off and the first target holder is rotated to a third desired sputtering target while using the second ion beam source to deposit a portion of the second desired sputtering target onto the first material layer to form a second material layer. Further, the second ion beam source can be turned off while using the first ion beam source to deposit a portion of the third desired sputtering material onto the second material layer to form a third material layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings:

FIG. 7 is an oblique view of the target holder assembly illustrated in FIG. 5.

DETAILED DESCRIPTION OF THE PREFERRED EMBODIMENT

Figure 3:
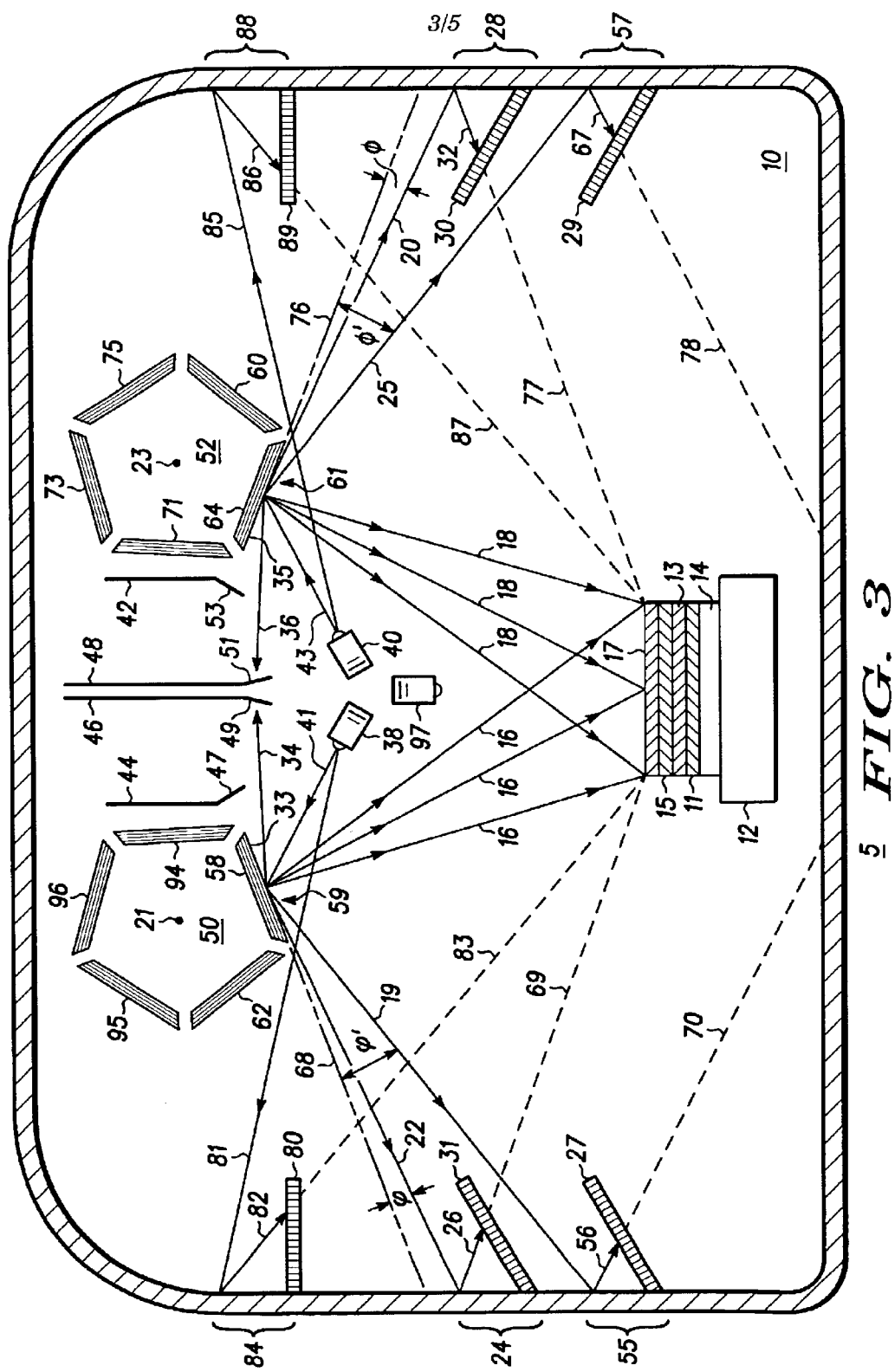
FIG. 3 is a sectional view of a dual ion beam deposition apparatus in accordance with the present invention.

Turn now to FIG. 3, which illustrates a simplified plan view of a dual ion beam deposition apparatus 5 in accordance with the present invention. Dual ion beam deposition apparatus 5 will be used to illustrate a method of depositing a material by sputtering a target material, the method having an improved throughput and improved shielding. However, it will be understood that other deposition systems, such as a physical vapor deposition system, or the like, could be used. The process of depositing a material by sputtering a target material is well known to those skilled in the art. To improve the throughput, dual ion beam deposition apparatus 5 includes at least two ion beam sources and target holders which alternate in operation while depositing multiple layers onto a substrate, as will be discussed separately.

Dual ion beam deposition apparatus 5 includes a vacuum chamber 10. A substrate stage 12 is positioned therein vacuum chamber 10 and a substrate 14 is positioned on substrate stage 12. Substrate 14 can include, for example, a silicon wafer or a similar supporting substrate wherein it is desired to deposit a material film.

In the preferred embodiment, a target holder 50 is positioned within vacuum chamber 10. Target holder 50 is capable of holding at least one holding member, such as a sputtering target. In the preferred embodiment, target holder 50 holds a target 58 with a surface 33, a target 62, a target 95, a target 96, and a target 94, wherein target 58 is positioned in a desired sputtering position 59 facing an ion beam source 38. Further, target holder 50 is rotatable about an individual axis 21.

In the preferred embodiment, a target holder 52 is positioned within vacuum chamber 10 proximate to target holder 50. Target holder 52 is capable of holding at least one holding member, such as a sputtering target. In the preferred embodiment, target holder 52 holds a target 60 with a surface 35, a target 64, a target 75, a target 73, and a target 71 wherein target 60 is positioned in a desired sputtering position 61 facing an ion beam source 40. Further, target holder 52 is capable of rotating about an individual axis 23. It will be understood that target holders 50 and 52 can hold up to five targets in the preferred embodiment, but it is anticipated that holders 50 and 52 can hold a number of targets greater than or equal to one. The illustration of five such targets for each target holder 50 and 52 in this embodiment is for illustrative purposes only.

It will be understood that dual ion beam deposition apparatus 5 can include more than two ion beam sources. For example, it is well known by those skilled in the art that deposition systems typically include an assist ion beam source 97 which is used to clean substrate 14 and subsequent layers grown thereon; for example nickel, iron, cobalt, copper, tantalum, titanium, chromium, ruthenium, platinum, manganese, molybdenum, beryllium, silicon and other suitable deposition material.

It will also be understood that in some embodiments, substrate stage 12 can be moved or reoriented relative to target holders 50 and 52 to adjust a deposition angle of the incident flux. The targets are positioned with respect to substrate stage 12 so minimal change is needed in the deposition angle to obtain optimum uniformity of films deposited thereon substrate 14. In some cases it may be advantageous to make changes to the deposition angle for certain layers to optimize a rate of deposition, a film thickness profile, or a flux angle. In such cases, a control system operating dual ion beam deposition apparatus would idle ion beam sources 38 and 40 briefly while substrate stage 12 moves to a new deposition angle.

In the preferred embodiment, ion beam source 38 is positioned in vacuum chamber 10 and directs a flux of ions 41 at target holder 50. Further in the preferred embodiment, ion beam source 40 is positioned in vacuum chamber 10 and directs a flux of ions 43 at target holder 52. It is well known to those skilled in the art that when a flux of energetic ions strike a sputtering target, material from the sputtering target is sputtered through a range of angles relative to the sputtering target.

For example, when flux of ions 41 strikes target 58, material from target 58 is substantially sputtered in a direction 22, a direction 34, a direction 16, and a direction 19. The material generally sputtered in direction 16 will be incident on substrate 14, as desired, to grow a material film thereon. Further, a stray beam from ion flux 41 is substantially directed in a direction 81. The atoms generally sputtered in directions 22, 19, and 34 and the stray beam in direction 81 can cause significant contamination within chamber 10 and on substrate 14 by resputtering material from the chamber walls or fixtures.

Further, when flux of ions 43 strikes target 60, material from target 60 is sputtered in a direction 20, a direction 36, a direction 18, and a direction 25. The material generally sputtered in direction 18 will be incident on substrate 14, as desired, to grow a material film thereon. Further, a stray beam from ion flux 43 is substantially directed in a direction 85. The atoms generally sputtered in directions 20, 25, and 36 and the stray beam in direction 85 can cause significant contamination within chamber 10 and on substrate 14 by resputtering material from the chamber walls or fixtures.

It is well know by those skilled in the art that contamination in ion beam deposition systems is one important issue when designing such a system. To control contamination, several features are added to dual ion beam deposition system apparatus 5. For example, the material sputtered in direction 22 will strike chamber 10 in a region 24 and the material sputtered in direction 20 will strike chamber 10 in a region 28. The material sputtered in direction 22 is called a forward scattered flux and is sputtered at a shallow angle, $\Phi$, relative to a reference line 68 oriented parallel to surface 33 of desired sputtering position 59.

The material sputtered in direction 20 is also a forward scattered flux and is sputtered at a shallow angle, $\Phi$, relative to a reference line 76 oriented parallel to surface 35 of target 60. The forward scattered flux includes high energy ions which can sputter material from chamber 10 and contaminate material layers deposited thereon substrate 14. It will be understood that the angles $\Phi'$ and $\phi$ are typically in a range given approximately from 0° to 20°.

For example, the forward scattered flux incident to region 24 creates a contamination flux 26 and the forward scattered flux incident to region 28 creates a contamination flux 32 wherein contamination flux 26 and 32 include material sputtered from chamber 10. A substantial amount of contamination flux 26 can be incident upon substrate 14 along a reference line 69 and a substantial amount of contamination flux 32 can be incident upon substrate 14 along a reference line 77.

As a result, in the preferred embodiment, a baffle 31 is positioned on chamber 10 and proximate to region 24 and oriented substantially parallel to reference line 68. Further, a baffle 30 is positioned on chamber 10 and proximate to region 28 and oriented substantially parallel to reference line 76. One purpose of baffles 31 and 30 is to block contamination flux 26 and 32, respectively, from being deposited on substrate 14.

Figure 1:
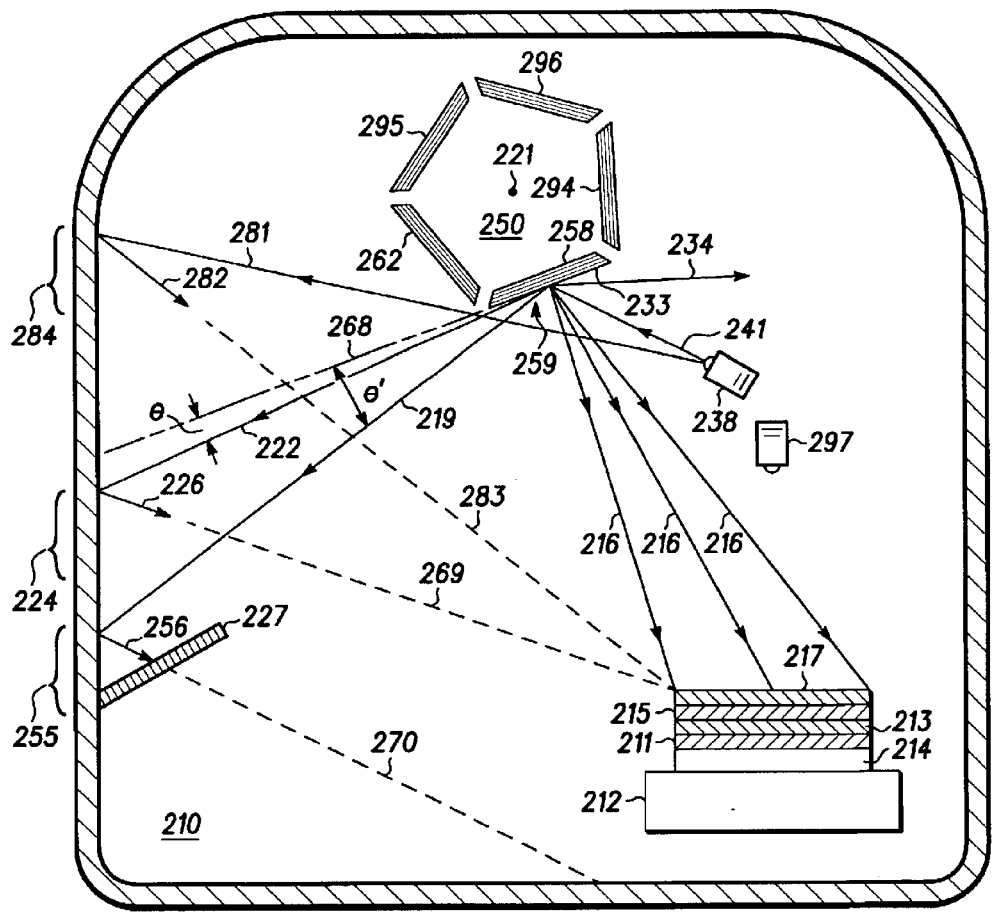
FIG. 1 is a sectional view of a prior art ion beam deposition apparatus.

In prior art embodiments, a baffle 27 or a baffle 29 are sometimes included in chamber 10 (baffles 27 and 29 are similar to baffle 227 illustrated in FIG. 1), but are generally positioned such that contamination flux 22 or 20 are not blocked sufficiently. Baffles 27 and 29 are generally positioned proximate to a region 55 and a region 57, respectively. Baffle 27 will substantially block a contamination flux 56 created by the material sputtered in direction 19 and baffle 29 will substantially block a contamination flux 67 created by the material sputtered in direction 25. The material sputtered in direction 19 is oriented at an angle $\Phi'$ relative to reference line 68 and the material sputtered in direction 25 is oriented at an angle $\phi'$ relative to reference line 76. It will be understood that the angles $\Phi'$ and $\phi'$ are approximately in a range from 20° to 60°.

Contamination flux 56 is generally sputtered along a reference line 70 and contamination flux 67 is generally sputtered along a reference line 78. Since reference lines 70 and 78 are substantially directed away from substrate 14, contamination fluxes 56 and 67 contaminate substrate 14 minimally. One solution to decrease the contamination in dual ion beam deposition system 5, therefore, is to position baffles 31 and 30 closer to reference lines 68 and 76, respectively, to substantially block contamination flux 26 and 32. Baffles 31 and 30 are positioned approximately parallel to directions 22 and 20, respectively, and with a length sufficient to prevent sputtered flux 26 and 32 from having line-of-sight access to the substrate 14.

Another source of contamination within dual ion beam deposition apparatus 5 is caused by the material sputtered in directions 34 or 36. For example, material sputtered in directions 34 and 36 typically include atoms that can be sputtered towards desired sputtering positions 61 (and target holder 52) and 59 (or target holder 50), respectively, and can then be resputtered onto substrate 14. One solution to this contamination problem is to include a shield 46 with an end 49 and a shield 48 with an end 51, wherein shields 46 and 48 are positioned therebetween target holders 50 and 52. To prevent the material sputtered in directions 34 and 36 from causing contamination thereon substrate 14, end 49 of shield 46 and end 51 of shield 48 can be angled, as illustrated in FIG. 3, to redirect the material sputtered or reflected from shields 46 and 48 away from substrate 14.

Another source of contamination in dual ion beam deposition apparatus 5 is caused by a beam tail (i.e. the stray beam) created by an ion beam source, wherein the beam tail is positioned proximate to a target. The beam tail can generally include high energy ions which can sputter contamination from various surfaces, such as target holder 50 or 52, an adjacent target, a back wall of the chamber, etc. When an over-spray caused by the beam tail hits an adjacent target or the back wall of the chamber, or other similar surface, the resultant undesirable sputtering causes contamination of a film being grown on substrate 14. To block these undesirable high energy ions from reaching target, 94 and target 71 a shield 44 is positioned proximate to target holder 50 and a shield 42 is positioned proximate to target holder 52, as illustrated in FIG. 3. To prevent the material sputtered off of shield 44 and shield 42 from causing contamination thereon substrate 14, end 47 of shield 44 and end 53 of shield 42 can be angled, as illustrated in FIG. 3, to redirect the undesired sputtered material away from substrate 14.

As mentioned previously, some of the stray beam from ion flux 41 is substantially directed in direction 81. The stray beam in direction 81 can cause significant contamination within chamber 10 and on substrate 14 by creating a contamination flux 82 directed along a reference line 83 toward substrate 14. Contamination flux 82 generally includes sputtered material from the chamber walls in region 84 or fixtures. Further, the stray beam from ion flux 43 is substantially directed in direction 85. The stray beam in direction 85 can cause significant contamination within chamber 10 by creating a contamination flux 86 directed along a reference line 87 toward substrate 14. Contamination flux 86 generally includes undesirable sputtered material from the chamber walls in region 88 or fixtures.

As a result, in the preferred embodiment, a baffle 80 is positioned on chamber 10 and proximate to region 84 and oriented to substantially block contamination flux 82 from reaching substrate 14. Further, a baffle 89 is positioned on chamber 10 and proximate to region 88 and oriented to substantially block contamination flux 86 from reaching substrate 14. Thus, the contamination from flux 82 and 86 is substantially reduced and higher quality films can be grown thereon substrate 14.

As mentioned previously, to improve the throughput, dual ion beam deposition apparatus 5 includes dual ion beam sources and dual target holders which alternate in operation while depositing multiple layers onto a substrate. When a first ion beam source-target pair is actively depositing a first layer on a substrate, a second ion beam source-target pair can idle (i.e. a plasma is generated, but an ion beam is not present) while its target holder rotates to a next target. The second ion beam source turns on to deposit a second layer thereon the first layer as soon as the first layer is deposited. The two source-target pairs continue to alternate depositions until a material layer stack is formed thereon the substrate. This provides nearly continuous layer deposition and minimizes a latency time, as will be discussed presently.

To illustrate the method of operation, consider the following example. Assume that it is desired to deposit a material layer 11 on substrate 14, a material layer 13 on material layer 11, a material layer 15 on material layer 13, and a material layer 17 on material layer 15 as illustrated in FIG. 3. Further assume that material layer 11 includes material sputtered from target 58, material layer 13 includes material sputtered from target 60, material layer 15 includes material sputtered from target 62, and material layer 17 includes material sputtered from target 64.

Initially, target 58 is positioned in desired sputtering position 59 and target 60 is positioned in desired sputtering target 61. To deposit material layer 11, ion beam source 38 is turned on and ion beam source 40 is blocked or otherwise turned off such that material is not sputtered from target 60. After layer 11 is deposited, ion beam source 38 is blocked or otherwise turned off and ion source 40 is turned on to deposit material layer 13. In the meantime, target holder 50 is rotated about rotation axis 21 so that target 62 is positioned in desired sputtering position 59.

After material layer 13 has been deposited, ion beam source 40 is turned off and ion beam source 38 is turned on to deposit material layer 15. In the meantime, target holder 52 is rotated about rotation axis 23 so that target 64 is positioned in desired sputtering position 61. After material layer 15 has been deposited, ion beam source 38 is turned off and ion beam source 40 is turned on to deposit material layer 17.

An advantage of this deposition method and apparatus is that a material layer is almost continuously being deposited on substrate 14 wherein the latency time has been significantly decreased. Since typical MRAM devices require a significant number of layers, the fabrication time and cost has been dramatically reduced. A similar benefit is realized for the fabrication of other multi-layer thin-film structures including other magnetic multi-layers such as those used in magnetic field sensors and multi-layer optical coatings for ultra-violet and x-ray wavelengths.

Figure 2:
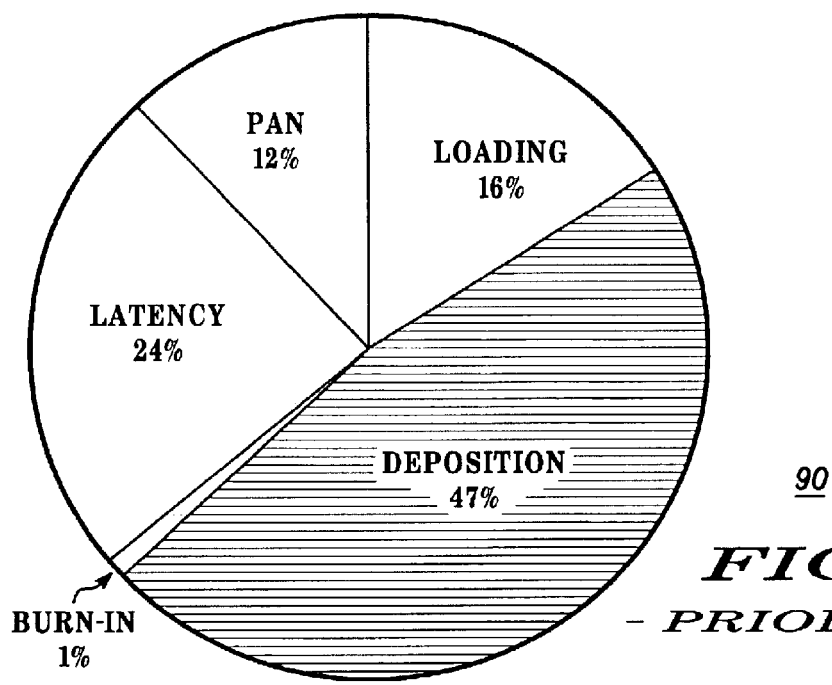
FIG. 2 is a graph illustrating the throughput of the ion beam deposition apparatus used in the prior art.
Figure 4:
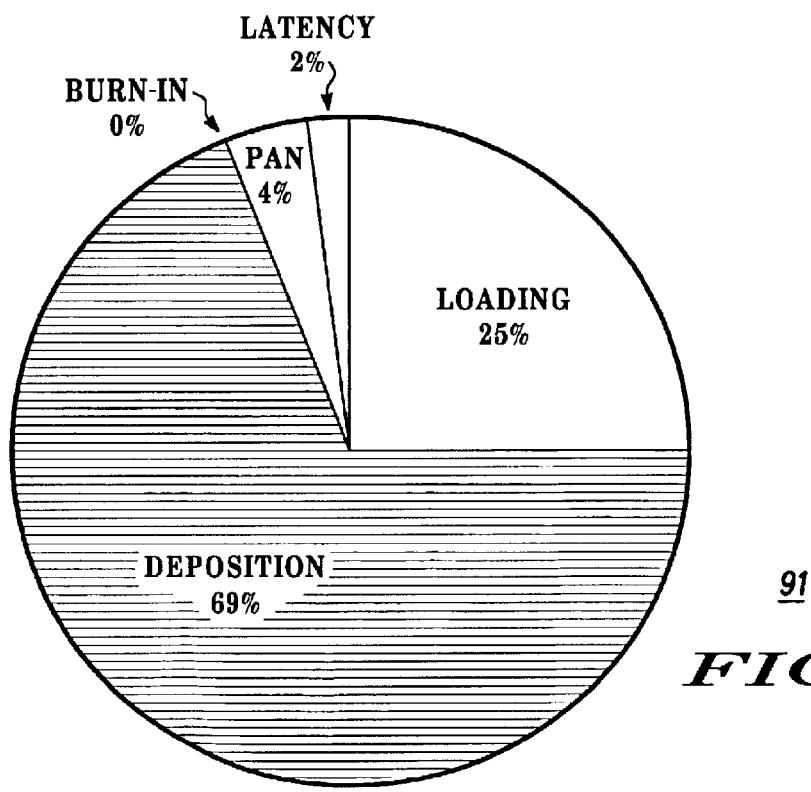
FIG. 4 is a graph illustrating the throughput of the dual ion beam deposition apparatus in accordance with the present invention.

Turn now to FIG. 4 which illustrates a pie chart 91 for the throughput of dual ion beam deposition apparatus 5. Pie chart 91 represents a percentage of time that apparatus 5 spends performing certain tasks during the deposition sequence. For example, apparatus 5 spends approximately 69% of its time depositing material layers, 25% of its time transferring wafers in and out of chamber 10, 4% of its time panning substrate 14. The latency time of dual ion beam deposition apparatus 5 is 2%, which is significantly decreased from the prior art value of 24% (See FIG. 2).

The latency time is that when apparatus 5 has completed one layer but has not begun the next layer because it is waiting for a task to finish. For example, it is well know by those skilled in the art that target holder 50 takes approximately 5 seconds to 10 seconds to rotate from one target (i.e. target 58) to a next target (i.e. target 62) in a deposition sequence. Also, it is well known by those skilled in the art that various target cleaning steps and beam setup steps are performed during the deposition sequence. To take full advantage of the configuration shown in FIG. 5, the control system should perform target cleans and beam setup steps when wafers are being transferred between the deposition chamber and other chambers of the system. As illustrated in FIG. 4, apparatus 5 now spends a significantly larger percentage of its time (69%) depositing films, as desired.

To further improve the throughput, dual ion beam deposition apparatus 5 can be designed to be a "sputter down" deposition system. Ion beam deposition systems are traditionally "sputter up" systems even though the time it takes to pan substrate stage 12 over has a negative impact on throughput. The terms "sputter up" and "sputter down" are well known by those skilled in the art and will not be elaborated upon further here. For higher throughput, target holders 50 and 52 can be located above and on opposite sides of substrate stage 12 to eliminate the 180° table pan required for sputter up operation.

Figure 5:
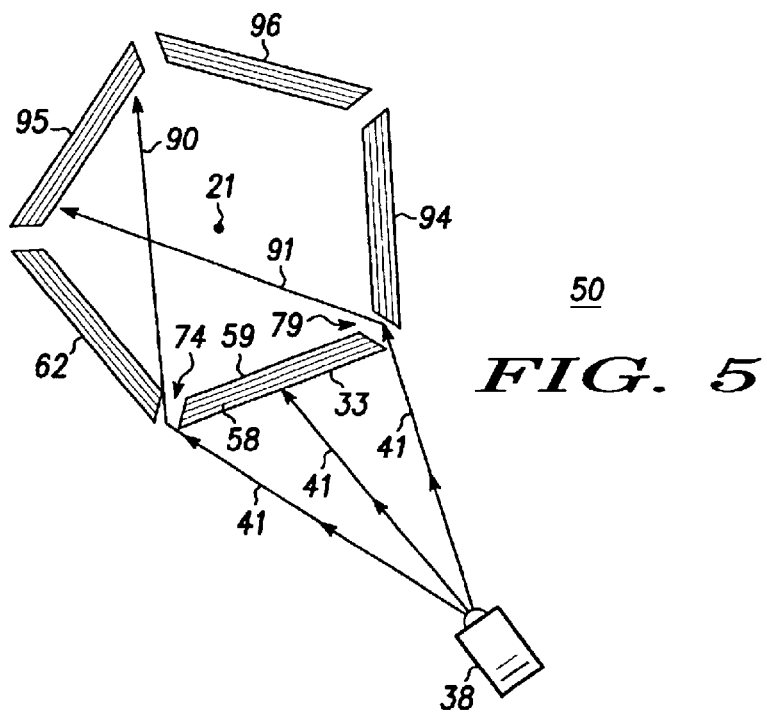
FIG. 5 is a sectional view of a target holder in accordance with the present invention.

Turn now to FIG. 5 which shows an expanded view of target holder 50 to illustrate still another source of contamination within dual ion beam deposition apparatus 5. It will be understood that a similar discussion is valid for target holder 52, but we are only discussing holder 50 for simplicity and ease of discussion. This source of contamination is caused by an ion beam 90 and 91. In this example, ion beam 90 is a portion of ion beam 41 incident to target 58 going through a gap 74 spaced between target 58 and target 62. Further, ion beam 91 is a portion of ion beam 41 incident to target 58 going through a gap 79 spaced between target 58 and target 94. Ion beams 90 and 91 cause sputtering of target mounting hardware (not shown) positioned within-target holder 50. Ion beams 90 and 91 can also cause sputtering of a target adjacent to target 58 (i.e. targets 62 and 94).

In the preferred embodiment, target holder 50 includes five positions for holding targets. When the targets are arranged as shown in FIG. 5, very little of the material sputtered by beam 90 can get out through the gaps between targets but a significant amount of material can escape out the ends of the target assembly, roughly along the axis of rotation 21, as illustrated in FIG. 7. The solution to this source of contamination is to place a cover 98 and 99 on each end of the target holder 50 as shown. Covers 98 and 99 substantially prevent the material sputtered by beams 90 and 91 from escaping from the inside of target holder 50 which significantly reduces contamination.

Figure 6:
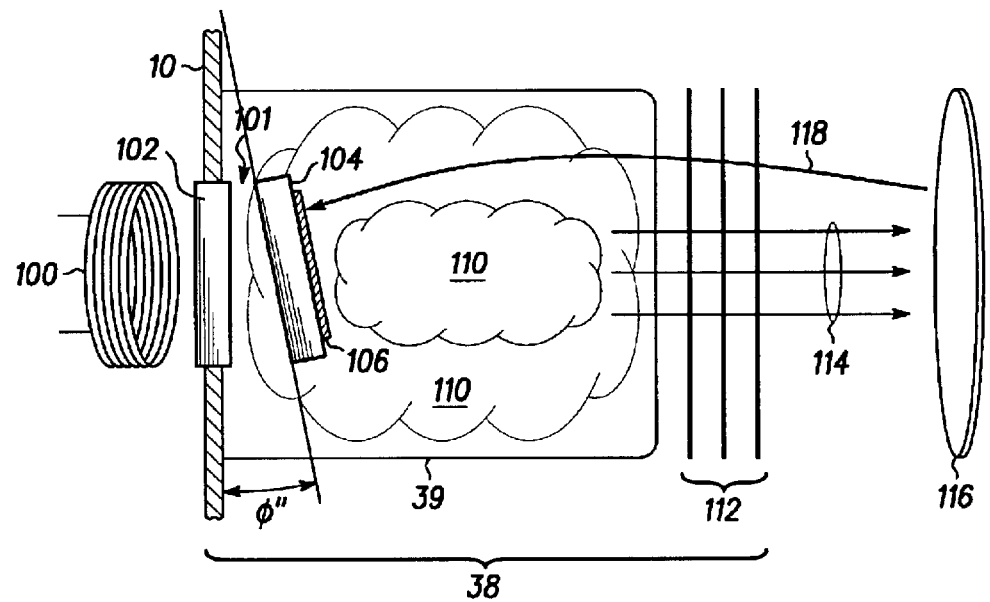
FIG. 6 is a sectional view of a dielectric window for striking a plasma in accordance with the present invention.

Turn now to FIG. 6 which illustrates a portion of dual ion beam deposition apparatus 5 showing a cross sectional view of ion beam source 38. It will be understood that a similar discussion is valid for ion beam source 40, but we are only discussing ion beam source 38 for simplicity and ease of discussion. Ion beam sources 38 and 40 are typically radio frequency (hereinafter referred to as "RF"). RF ion beam sources are in principle more reliable and stable than filament sources. However, the limiting factor in how long an RF ion beam source can deposit material layers without maintenance is determined by the coating of a dielectric window 102 positioned on vacuum chamber wall 10 and spaced between an RF antenna 100 and an ion plasma chamber 39. As is well known by those skilled in the art, a flux of ions 114 is produced by allowing a low pressure gas 110 into plasma chamber 39 and by coupling an electromagnetic energy between RF antenna 100 and gas 110 in plasma chamber 39 through dielectric window 102 to strike a plasma within chamber 39.

When dielectric window 104 becomes coated with a conductive material 106, such as sputtered material 118 from a metal target 116 that enters ion beam source 38 through holes in grids 112, ion beam source 38 characteristics drift and eventually it does not strike properly or at all and must be cleaned. The cleaning process is time consuming and expensive because the vacuum chamber must be opened up and the deposition of the material layers is interrupted.

A solution to this problem is to allow a gap 101 spaced between dielectric window 102 and an interior window 104, as illustrated in FIG. 6. Window 104 is positioned adjacent to window 102 wherein window 104 is oriented at a nonzero angle, θ", relative to window 102 to form gap 101. It will be understood that gap 101 is typically on the order of several millimeters. However, other suitable distances may be appropriate for gap 101.

Window 104 gets coated with sputtered metal 118 backscattered from target 116, but gap 101 between window 104 and window 102 allows plasma 110 to couple to RF antenna 100. Alternatively, window 104 can be approximately parallel to window 102 so long as a mechanism is in place to create a significant gap (which is typically several millimeters) between windows 102 and 104 where plasma 110 can strike and then spread to plasma chamber 39. As a result, the time between necessary cleaning maintenance is dramatically increased.

Thus, a new and improved ion beam deposition apparatus has been disclosed. The ion beam deposition system apparatus includes dual ion beam sources and dual target holders which can be used in a deposition sequence which dramatically increases the throughput of the system. The throughput is increased because the latency time is reduced. Further, the ion beam deposition system apparatus is provided with improved shielding to reduce contamination of a film being deposited.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same,

The invention claimed is:

1. A method of depositing a material by sputtering, the method comprising the steps of:

providing a vacuum chamber including a first window and a second window positioned between an antenna and a plasma chamber, the second window being positioned adjacent to said first window wherein the second window is positioned relative to the first window to form a gap spaced therebetween said first and second windows;

providing a substrate positioned in the vacuum chamber;

providing a plurality of target holding structures, with each target holding structure holding at least one target holding member in the vacuum chamber wherein each target holding structure has an ion beam source for directing ions at the at least one target holding member of each of the plurality of target holding structures;

bringing a desired one of the at least one target holding members which bears a first desired sputtering target into a first sputtering position for each target holding structure; and alternately using the ion beam source for each target holding structure to deposit alternating layers of the desired sputtering target from each of the plurality of target holding structures onto the substrate.

2. A method as claimed in claim 1 including in addition the step of positioning at least one baffle proximate to at least one of the plurality of target holding structures to shield the substrate from a contamination flux produced by a beam tail incident to the vacuum chamber or other fixtures or shields in the vacuum chamber.

3. A method as claimed in claim 1 including in addition the step of positioning at least one baffle proximate to at least one of the plurality of target holding structures to shield the substrate from a contamination flux produced by a forward scattered flux incident to the vacuum chamber or other fixtures or shields in the vacuum chamber.

4. A method as claimed in claim 1 including in addition the step of positioning at least a first shield with an end proximate to at least one of the plurality of target holding structures to shield a sputtering target positioned adjacent to the first sputtering position from an ion beam tail wherein the end of the first shield is substantially directed away from the substrate.

5. A method as claimed in claim 1 including in addition the step of positioning at least a first shield with an end therebetween each adjacent target holding structure wherein the end of the at least a first shield is substantially directed away from the substrate.

6. A method as claimed in claim 1 wherein at least a first shield is positioned on at least one of a surface and an opposed surface of one of the plurality of target holding structures.

7. A method as claimed in claim 1 wherein each target holding structure in the plurality of target holding structures is rotatable about an individual axis.

8. A method as claimed in claim 7 wherein the step of alternately using the ion beam source for each target holding structure further includes the step of depositing a layer from a stationary target holding structure while rotating at least one of the other target rotating structures.

9. A method of depositing a material by sputtering, the method comprising the steps of:
   providing a vacuum chamber including a first window and a second window positioned between an antenna a plasma chamber, the second window being positioned adjacent to said first window wherein the second window is positioned relative to the first window to form a gap spaced therebetween said first and second windows;
   providing a substrate stage for holding a substrate, the substrate stage being positioned in the vacuum chamber;
   providing a first target holder capable of holding a first plurality of target holding members, said first target holder being placed in the vacuum chamber and being rotatable about a first individual axis;
   providing a second target holder capable of holding a second plurality of target holding members, said second target holder being placed in the vacuum chamber proximate to the first target holder and being rotatable about a second individual axis;
   providing a first ion beam source for directing ions at a first desired sputtering target in a first target holding member of the first plurality of target holding members;
   providing a second ion beam source for directing ions at a second desired sputtering target in a first target holding member of the second plurality of target holding members;
   bringing the first target holding member of the first plurality of target holding members which bears the first desired sputtering target into a first sputtering position;
   stopping the second ion beam source and depositing a portion of the first desired sputtering target using the first ion beam source onto the substrate to form a first material layer while bringing the first target holding member of the second plurality of target holding members which bears the second desired sputtering target into a second sputtering position;
   stopping the first ion beam source; and
   depositing a portion of the second desired sputtering target using the second ion beam source onto the substrate to form a second material layer.

10. A method as claimed in claim 9 further including the step of rotating the first target holder to bring a second target holding member of the first plurality of target holding members which bears a third desired sputtering target into the first desired sputtering position while the second material layer is being formed.

11. A method as claimed in claim 9 including in addition the step of positioning at least one baffle proximate to at least one of the first and second target holders to shield the substrate from contamination produced by a forward scattered flux.

12. A method as claimed in claim 9 including in addition the step of positioning at least a first shield proximate to at least one of the first and second target holders to shield an adjacent target from an ion beam tail.

13. A method as claimed in claim 9 including in addition the step of positioning at least a first shield therebetween the first target holder and the second target holder.

14. A method as claimed in claim 9 wherein at least a first shield is positioned over an open area of one of the first and second target holders.

15. An ion beam deposition system for sputtering material layers comprising:
   a vacuum chamber including a first window and a second window positioned between an antenna and a plasma chamber, the second window being positioned adjacent to said first window wherein the second window is positioned relative to the first window to form a gap spaced therebetween said first and second windows;
   a substrate stage for holding a substrate within the vacuum chamber; and
   a plurality of target holding structures, wherein each target holding structure is rotatable about an individual axis, with each target holding structure capable of holding at least one target holding member in the vacuum chamber wherein each target holding structure has an ion beam source for directing ions at the at least one target holding member of each of the plurality of target holding structures.

16. An apparatus as claimed in claim 15 wherein at least one baffle is positioned proximate to at least one of the first and second target holder to shield the substrate from contamination produced by a forward scattered flux.

17. An apparatus as claimed in claim 15 wherein at least a first shield is positioned proximate to at least one of the first and second target holders to shield an adjacent target from an ion beam tail.

18. An apparatus as claimed in claim 15 wherein at least a first shield is positioned therebetween the first target holder and the second target holder.

19. An apparatus as claimed in claim 15 wherein at least a first shield is positioned over an open area of one of the first and second target holders.

20. An apparatus as claimed in claim 15 wherein material layers include at least one of nickel, iron, cobalt, copper, tantalum, titanium, chromium, ruthenium, platinum, manganese, molybdenum, beryllium, and silicon,.

21. An ion beam source for sputtering a target, the ion beam source comprising:

a first window with a side and an opposed side;

a second window with a side and an opposed side wherein the side of the second window is positioned proximate to the opposed side of the first window and positioned relative to the first window to form a gap with a volume spaced therebetween said first and second windows;

a plasma chamber capable of forming a plasma therein, the plasma chamber being positioned proximate to the opposed side of the second window; and an antenna positioned proximate to the side of the first window.

22. An apparatus as claimed in claim 21 wherein the volume of the gap is large enough so that the antenna can strike a plasma therebetween the first and second windows.

23. An apparatus as claimed in claim 21 wherein an angle between the first window and the second window is in a range from 1° to 20°.

24. An apparatus as claimed in claim 21 wherein an angle between the first window and the second window is in a range from 1° to 5°.

25. An apparatus as claimed in claim 21 wherein the gap is within a range from 1.

26. An apparatus as claimed in claim 21 wherein the gap is within a range from 1 mm to 3 mm.

27. An apparatus as claimed in claim 21 wherein at least one of the first and second windows is positioned within a vacuum chamber.

* * * * *

UNITED STATES PATENT AND TRADEMARK OFFICE
CERTIFICATE OF CORRECTION

PATENT NO. : 6,783,637 B2
DATED : August 31, 2004
INVENTOR(S) : Jon Slaughter et al.

It is certified that error appears in the above-identified patent and that said Letters Patent is hereby corrected as shown below:

Column 12,
Line 7, delete "beani" and add -- beam --;

Column 14,
Line 11, after "range from 1" add -- mm to 10 mm. --.

Signed and Sealed this

Twenty-seventh Day of September, 2005

JON W. DUDAS
*Director of the United States Patent and Trademark Office*